(12) United States Patent
Hietanen

(10) Patent No.: US 8,159,049 B2
(45) Date of Patent: Apr. 17, 2012

(54) SEMICONDUCTOR STRUCTURE FOR IMAGING DETECTORS

(75) Inventor: Iiro Hietanen, Härkäpää (FI)

(73) Assignee: Detection Technology Oy, Micropolis (FI)

( * ) Notice: Subject to any disclaimer, the term of this patent is extended or adjusted under 35 U.S.C. 154(b) by 1098 days.

(21) Appl. No.: 10/522,262

(22) PCT Filed: Jul. 18, 2003

(86) PCT No.: PCT/FI03/00575
§ 371 (c)(1),
(2), (4) Date: Sep. 21, 2005

(87) PCT Pub. No.: WO2004/012274
PCT Pub. Date: Feb. 5, 2004

(65) Prior Publication Data
US 2006/0097290 A1    May 11, 2006

(30) Foreign Application Priority Data

Jul. 26, 2002 (GB) .................................. 0217394.6

(51) Int. Cl.
*H01L 29/40* (2006.01)
(52) U.S. Cl. ........ 257/621; 257/459; 257/432; 257/434; 257/462; 257/737; 257/774; 257/911
(58) Field of Classification Search .................. 257/621, 257/432, 434, 462, 737, 738, 774, 911
See application file for complete search history.

(56) References Cited

U.S. PATENT DOCUMENTS

| 4,227,942 A | 10/1980 | Hall |
| 4,626,613 A | 12/1986 | Wenham et al. |
| 4,914,301 A | 4/1990 | Akai |
| 4,984,358 A | 1/1991 | Nelson |

(Continued)

FOREIGN PATENT DOCUMENTS

EP    1280207    1/2003

(Continued)

OTHER PUBLICATIONS

E.M. Chow et al. "Electrical Through-Wafer Interconnects and Microfabricated Cantilever Arrays Using Through-Wafer Silicon Etching," Thesis at Stanford University, Aug. 2001, 196 pages.

(Continued)

*Primary Examiner* — Michael Shingleton
(74) *Attorney, Agent, or Firm* — Ryan, Mason & Lewis, LLP

(57) ABSTRACT

There is disclosed a photo-detector array including a plurality of sub-arrays of photo-detectors, the photo-detectors of each sub-array being formed on a substrate with an active area of each photo-detector being formed on a surface of the substrate, there further being formed for each photo-detector a conductive via through the substrate from an upper surface thereof to a lower surface thereof to connect the active area of each photo-detector to the lower surface of the substrate, wherein a plurality of said sub-arrays of photo-detectors are placed adjacent to each other in a matrix to form the photo-detector array. An imaging system comprising: a radiation detector including such a photo detector array, a radiation source facing the radiation detector, and means for controlling the radiation detector and the radiation source is also disclosed. A method for making such an array is also disclosed.

15 Claims, 8 Drawing Sheets

U.S. PATENT DOCUMENTS

| | | | |
|---|---|---|---|
| 5,424,245 | A | 6/1995 | Gurtler et al. |
| 5,468,652 | A | 11/1995 | Gee |
| 5,485,039 | A * | 1/1996 | Fujita et al. ............... 257/774 |
| 5,587,119 | A * | 12/1996 | White ............................. 264/104 |
| 5,599,744 | A | 2/1997 | Koh et al. |
| 5,618,752 | A | 4/1997 | Gaul |
| 6,173,031 | B1 | 1/2001 | Hoffman et al. |
| 6,175,141 | B1 | 1/2001 | Hofbauer et al. |
| 6,225,651 | B1 | 5/2001 | Billon |
| 6,396,898 | B1 | 5/2002 | Saito et al. |
| 6,658,082 | B2 | 12/2003 | Okumura et al. |
| 6,703,689 | B2 * | 3/2004 | Wada ............................. 257/621 |
| 6,836,020 | B2 | 12/2004 | Cheng et al. |
| 7,052,939 | B2 * | 5/2006 | Huang et al. ............... 438/146 |
| 7,148,551 | B2 | 12/2006 | Yoneta et al. |
| 2002/0019069 | A1 | 2/2002 | Wada |
| 2002/0054659 | A1 | 5/2002 | Okumura et al. |
| 2003/0034496 | A1 | 2/2003 | Yoneta et al. |

FOREIGN PATENT DOCUMENTS

| | | |
|---|---|---|
| EP | 1525623 B1 | 2/2007 |
| JP | 63-157439 | 6/1988 |
| JP | 63157439 | 6/1988 |
| JP | 11009581 | 1/1999 |
| JP | 11-261086 | 9/1999 |
| JP | 2000-502215 | 2/2000 |
| JP | 2001-242253 | 9/2001 |
| JP | 2001-318155 | 11/2001 |
| JP | 2001318155 | 11/2001 |
| JP | 2002094082 | 3/2002 |
| JP | 2003-066149 | 3/2003 |
| WO | WO9723897 | 7/1997 |
| WO | WO 98/54554 A1 | 12/1998 |
| WO | 01/75977 | 10/2001 |
| WO | WO0175977 | 10/2001 |

OTHER PUBLICATIONS

E.M. Chow et al., "Process Compatible Polysilicon-Based Electrical Through-Wafer Interconnects in Silicon Substrates," Journal of Microelectromechanical Systems, Dec. 2002,pp. 631-640, vol. 11, No. 6, IEEE.

C.H. Cheng et al., "An Efficient Electrical Addressing Method Using Through-Wafer Vias for Two-Dimensional Ultrasonic Arrays," IEEE Ultrasonics Symposium, 2000, pp. 1179-1182.

C.H. Cheng et al., "Electrical Through-Wafer Interconnects with Sub-PicoFarad Parasitic Capacitance," IEEE Microelectromechnical Systems Conference, 2002, pp. 18-21.

V. Chandrasekaran et al., "Through-Wafer Electrical Interconnects for MEMS Sensors," Proceedings of ASME International Mechanical Engineering Congress and Exposition, Nov. 2001,pp. 1-6.

"Photodiode Characteristics and Applications," www.lightcatcher.com, Nov. 2007, 1 page.

Comparative Table 1-9 regarding Prior Art Documents.

OSI Optoelectronics, "Silicon Photodiodes," Physics and Technology, www.osioptoelectronics.com, Apr. 1982, pp. 1-11, No. 2.

E. M. Chow et al., "Through-Wafer Electrical Interconnects Compatible With Standard Semiconductor Processing", Solid-State Sensor and Actuator Workshop, Jun. 4-8, 2000, pp. 343-346, Hilton Head Island, South Carolina.

A.J. Frost, Opponent's Submissions for European Patent No. 1525623 filed in European Patent Office, Munich, Aug. 10, 2010, pp. 1-26.

* cited by examiner

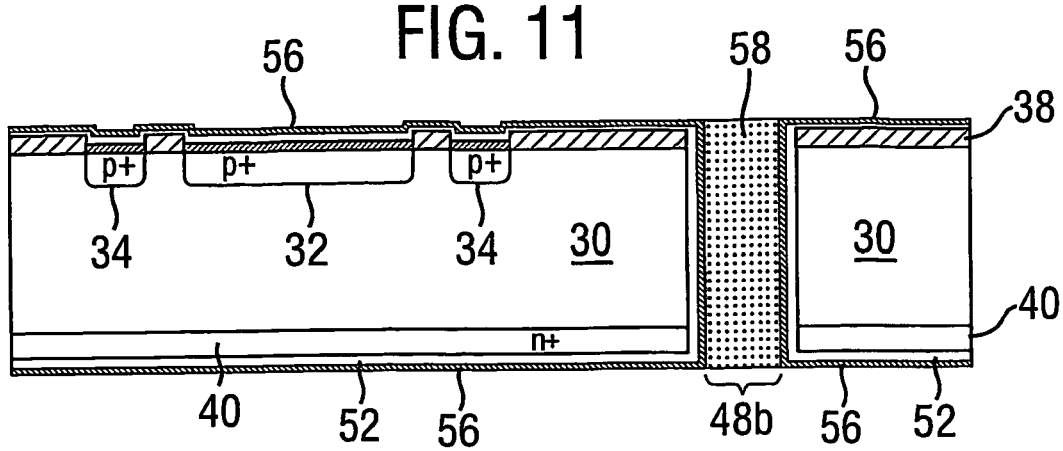
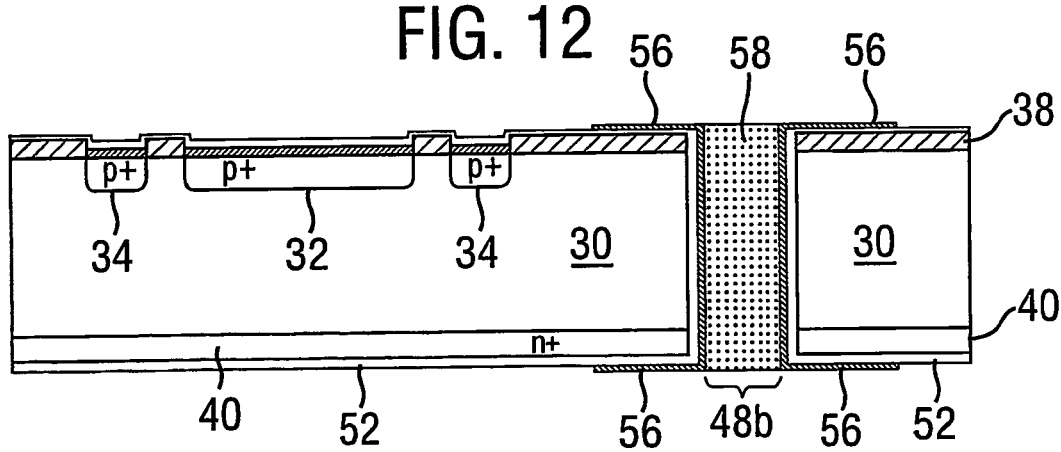
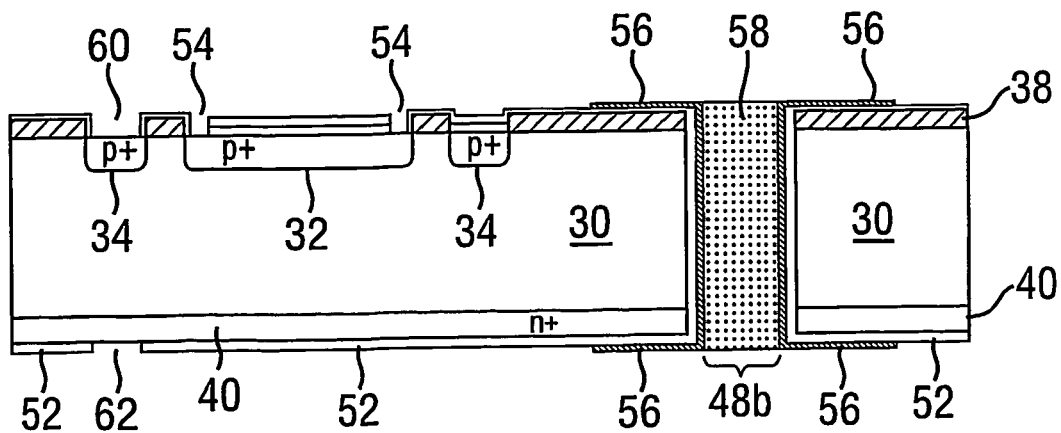

SEMICONDUCTOR STRUCTURE FOR IMAGING DETECTORS

FIELD OF THE INVENTION

The present invention relates to semiconductor devices, and particularly but not exclusively to photo-detectors for use in imaging systems.

BACKGROUND OF THE INVENTION

Photo-detectors are used in imaging systems for medical, security and industrial applications. One particular medical application of photo-detectors is in computed tomography (CT) systems.

In a typical CT system, an X-ray source with a fan-shaped X-ray beam and a two-dimensional radiation detector array are assembled on a mechanical support structure, known as a gantry. In use, the gantry is rotated around an object to be imaged in order to collect X-ray attenuation data from a constantly changing angle with respect to the object. The plane of the gantry rotation is known as an imaging plane, and it is typically defined to be the x-y plane of the coordinate system in a CT system. In addition, the gantry (or more typically the object) is moved slowly along the z-axis of the system in order to collect x-ray attenuation data for a required length of the object. Examples of current CT systems are discussed in U.S. Pat. Nos. 6,144,718 and 6,173,031.

The radiation detectors of current state of the art CT systems consist of a two-dimensional array of rare earth metal based scintillators and a corresponding two-dimensional array of silicon photodiodes. Both the scintillator crystals and the photodiodes are manufactured in two-dimensional arrays, which are then optically coupled to one another during detector manufacturing.

A typical state of the art detector array is shown in FIG. 1. A typical detector consists of an array of 16 rows and 16 columns of individual detector elements, i.e. 256 elements in total. Columns are organised in the z direction. The construction of the detector is well-known in the art. The array of detectors is generally illustrated in FIG. 1 by reference numeral 2. The z direction or z-axis is also shown in FIG. 1. The elements in rows are in the imaging plane, and produce sets of data known as 'slices'. In a medical CT machine, for example, each slice image corresponds to a two-dimensional X-ray image of a thin slice of a human body as seen in the direction of the body axis and the machine z-axis.

In CT imaging systems, the size of the detector in the imaging plane is increased by placing individual detector arrays, such as the array shown in FIG. 1, adjacent to each other to thereby increase the size of the detector in the imaging plane. An edge 4 of the detector of FIG. 1 may be placed alongside a corresponding edge of a corresponding detector array, and thereby a larger area can be built up.

A key trend in the CT industry is to build CT machines with more detector elements in order to collect more X-ray attenuation data for each gantry rotation and therefore to speed up the measurements, to improve the accuracy of the measurements, and to decrease patient radiation dose in medical applications. An increase in the number of detector elements similarly may have advantages in other imaging applications, and is not restricted to medical or CT systems.

In current CT detector constructions, a major limiting factor in providing more detector elements is the need to readout the electrical signals from the individual photo-detectors of the detector array. In the current art, the readout of these signals is facilitated by manufacturing very narrow metal lines (typically 5 to 20 μm) on top of the photo-detector chip, between the active photo-detector elements. A single metal line carries the signal of one photo-detector to the edge of the photo-detector chip, in the z direction, to an area which is specially reserved for the purpose of connecting the signals from the photo-detectors by wire bonding to a substrate placed beneath the photo-detector chip or to a multiplexing or signal processing ASIC chip. Using this method, there is a physical limitation on the size of a photo-detector array that may be manufactured. The number of electrical elements at the chip edge is limited, and this limits the number of photo-detector elements which can be connected. The detector cannot get larger in the z-direction in particular.

This is illustrated by FIG. 1. The photo-detector array 2 is provided with an area 6 and 8 either side of the array in the z direction, which areas provide for connection to a respective set of electrical wires, 10 and 12. The signals from the photo-detector array may be multiplexed or processed in integrated electronics chips or ASICs located in areas 6 and 8 before the signals are connected to electrical wires, 10 and 12. Because of the need to accommodate the physical wires and their connections, the number of photo-detectors in an array is limited. In particular, it is not possible to add further photo-detectors in the z direction. The physical wires 10 and 12 prevent any expansion of the photo-detector array in the z direction, such that additional photo-detector arrays cannot be added in the z direction. That is, although photo-detectors can be joined together side-by-side, in the horizontal direction in FIG. 1, they cannot be joined to top-to-bottom, in the vertical direction. This is because of the need to connect the wires 10 and 12 at the top and bottom.

A photo-detector with the possibility of expansion in the z direction is known as a 'tileable' detector. In order to provide a tileable detector, it is necessary to make the electrical connections to each photo-detector without wiring the photo-detectors to the photo-detector chip edge. If this can be achieved, there is no limit to the growth of the photo-detector array and consequently the number of photo-detector elements.

One solution to the problem of achieving a tileable detector is suggested in U.S. Pat. No. 6,396,898.

Embodiments of the present invention aim to address one or more of the above problems and to provide an improved photo-detector array.

SUMMARY OF THE INVENTION

In accordance with the present invention there is provided a substrate including a semiconductor device having an active area on one surface of the substrate, wherein there is provided a conductive via from the one surface of the substrate to the other surface of the substrate for connecting the active area to the other surface of the substrate.

The conductive via is preferably electrically isolated from the substrate. The conductive via may comprise polysilicon. The polysilicon may be formed on the inner walls of the via. There may be provided a further conductive element from one side of the substrate to the other within the conductive via. There may be provided a filling material within the conductive via. There may be provided a further conductive element connected between the active area of the device and the conductive via.

There may be provided a further conductive element on the other side of the substrate connected to the conductive via. The further conductive element on the other side of the substrate is preferably for making an off-chip connection to the conductive via. The semiconductor device is preferably a photodiode. The active area on the one surface of the device is preferably an anode. The semiconductor device may include a further active area on the other side of the substrate. The active area on the other side of the substrate is preferably a cathode.

There may be provided a plurality of semiconductor devices and a plurality of conductive vias for connecting an active area of semiconductor devices on one surface of the substrate to another surface of the substrate. The plurality of semiconductor devices may be formed as an array. There may be provided a conductive via for each semiconductor device. The active areas of each semiconductor device may be provided on the same side of the substrate.

The semiconductor device may be a photodiode. The semiconductor device may be a photodiode of a medical imaging system. The medical imaging system may be a computed tomography system.

The present invention further provides a photo-detector array including a plurality of sub-arrays of photo-detectors, the photo-detectors of each sub-array being formed on a substrate with an active area of each photo-detector being formed on a surface of the substrate, there further being formed for each photo-detector a conductive via through the substrate from an upper surface thereof to a lower surface thereof to connect the active area of each photo-detector to the lower surface of the substrate, wherein a plurality of said sub-arrays of photo-detectors are placed adjacent to each other in a matrix to form the photo-detector array. The matrix may extend in two directions.

The invention still further provides an imaging system comprising: a radiation detector including a photo detector array as defined above, a radiation generator facing the radiation detector, and means for controlling the radiation detector and the radiation generator.

The radiation generator may be an X-ray generator. The radiation detector and the radiation generator may be radially mounted in a cylindrical scanning structure. The means for controlling may comprise a computer system.

The invention still further provides a method of manufacturing a semiconductor device comprising: providing an active area of the semiconductor device on one surface of a substrate; forming a conductive via through the semiconductor device from the one surface of the substrate to another surface of the substrate; and connecting the active area to the conductive via such that the active area is connected to the other surface of the substrate.

The method may further comprise the step of electrically isolating the conductive via from the substrate. The conductive via may comprise polysilicon. The method may further comprise the step of forming polysilicon on the inner walls of the via. The method may further comprise the step of providing a further conductive element from one side of the substrate to the other within the conductive via. The method may further comprise the step of providing a filling material within the conductive via.

The method may further comprise the step of providing a further conductive element connected between the active area of the device and the conductive via. The method may further comprise the step of providing a further conductive element on the other side of the substrate connected to the conductive via. The further conductive element may be a contact pad. The further conductive element on the other side of the substrate may be provided for making an off-chip connection to the conductive via.

The semiconductor device may be a photodiode. The active area on the one surface of the device may be an anode. The method may further comprise the step of providing a further active area on the other side of the substrate. The active area on the other side of the substrate may be a cathode.

The method may further comprise the step of providing a plurality of semiconductor devices and a plurality of conductive vias for connecting an active area of semiconductor devices on one surface of the substrate to another surface of the substrate. The plurality of semiconductor devices may be formed as an array. There may be formed a conductive via for each semiconductor device. The active areas of each semiconductor device may be formed on the same side of the substrate. The semiconductor device may be a photodiode. The semiconductor device may be a photodiode of a medical imaging system. The medical imaging system may be a computed tomography system.

The present invention also provides an array of semiconductor devices formed on a substrate, each of the devices having an active area at the surface of the substrate, at least one of the active areas being conductively connected to the other surface of the substrate through a conductive via. The conductive via is preferably adjacent the active area. Preferably all devices have a conductive via.

BRIEF DESCRIPTION OF DRAWINGS

For better understanding of the present invention, and to show as to how the same may be carried into effect, reference will now be made by way of example to the accompanying drawings in which:

FIGS. 2 to 15 illustrate the main steps in manufacturing a photo-detector array in accordance with a preferred embodiment of the invention;

DESCRIPTION OF PREFERRED
EMBODIMENTS OF THE INVENTION

The present invention is described hereinafter with reference to a particular set of embodiments. However the invention is not limited to such embodiments.

The invention is particularly described herein with reference to an example of a photo-detector array for a CT medical imaging system.

It should be noted that whilst the invention is illustrated herein by way of reference to various figures, none of these figures are drawn to scale, but rather are drawn to best illustrate various features of the present invention.

With reference to FIGS. 2 to 17, there are illustrated selected steps for manufacturing a photo-detector array for a CT imaging system in accordance with a preferred embodiment of the invention. A cross-section through an exemplary device substrate is used for the purpose of explaining the present invention. Only those steps relevant to an understanding of the present invention are shown. Other steps will be familiar to one skilled in the art.

Figure 1:
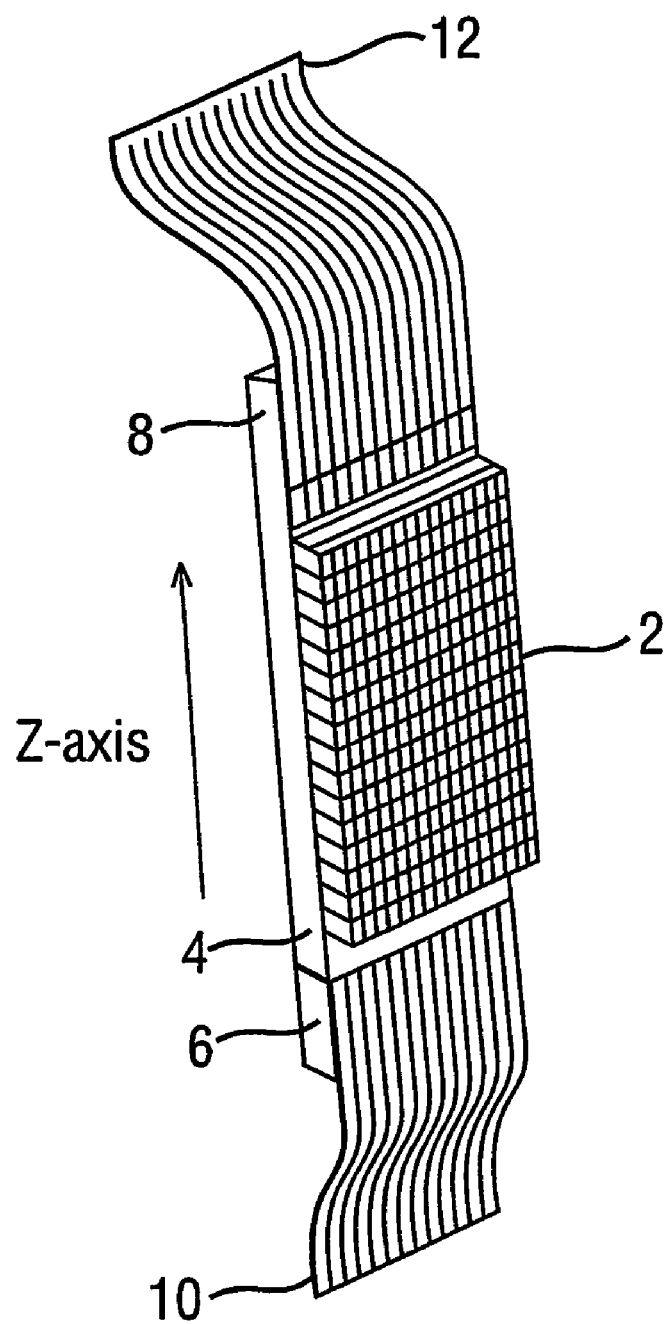
FIG. 1 illustrates the basic construction of a photo-detector array in accordance with one known arrangement.
Figure 2:
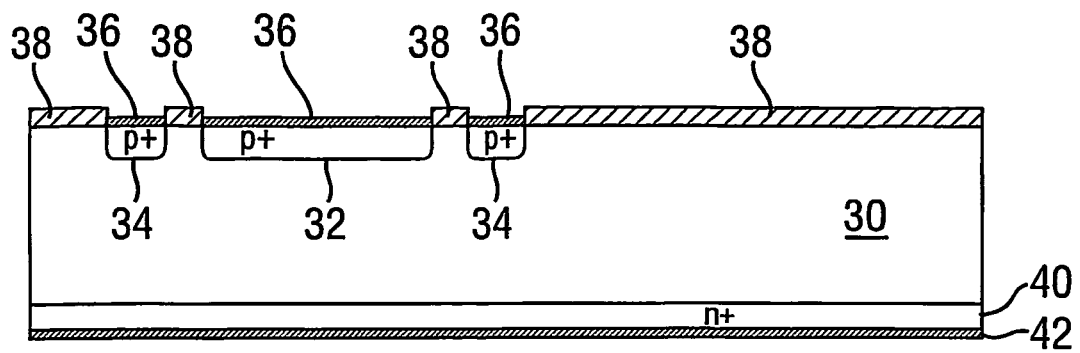

Referring to FIG. 2 there is illustrated a cross-section of a n-type semiconductor substrate 30 in which a photo-detector element is formed. A p+ type well 32 is formed in the upper surface of the substrate forming an active area of a photo diode. The active area 32 defines the anode of the photodiode. Additional p+ type wells 34 represent a guard ring for the anode active area. Thin layers of silicon dioxide 36 cover the surface of the p+ wells 32 and 34. A field oxide (FOX) layer 38 covers the remainder of the upper surface of the substrate. An n+implant layer 40 is formed on the under surface of the substrate, to form the cathode of the photo-diode. A thin silicon dioxide layer 42 covers the underside of the substrate and the n+ layer 40.

The structure of FIG. 2 is fabricated using the key process steps for manufacturing high quality diodes on silicon. Such standard techniques are known generally in the art, and especially in the art of fabricating photo-diodes for CT imaging applications, and are therefore not described herein. Process steps to achieve the structure shown in FIG. 2 are well-known.

Figure 3:
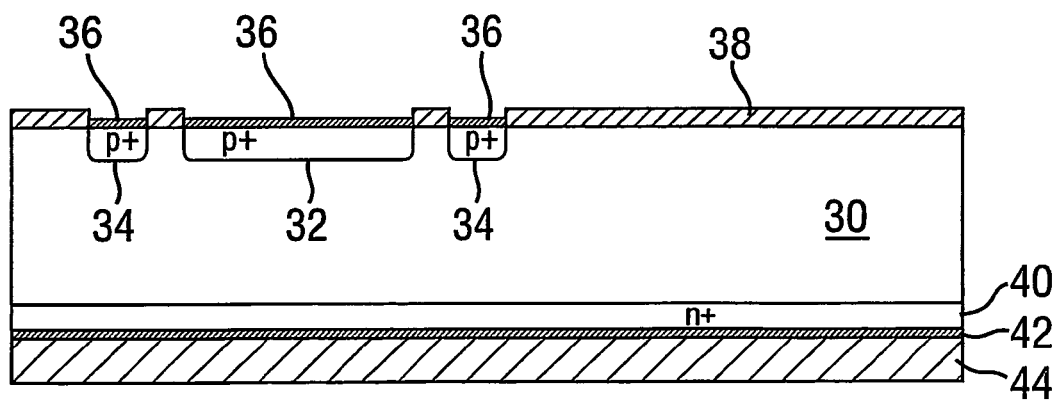

After the fabrication of the structure illustrated in FIG. 2, a protective low temperature oxide (LTO) layer 44 is grown on the underside of the substrate, as shown in FIG. 3.

Figure 4:
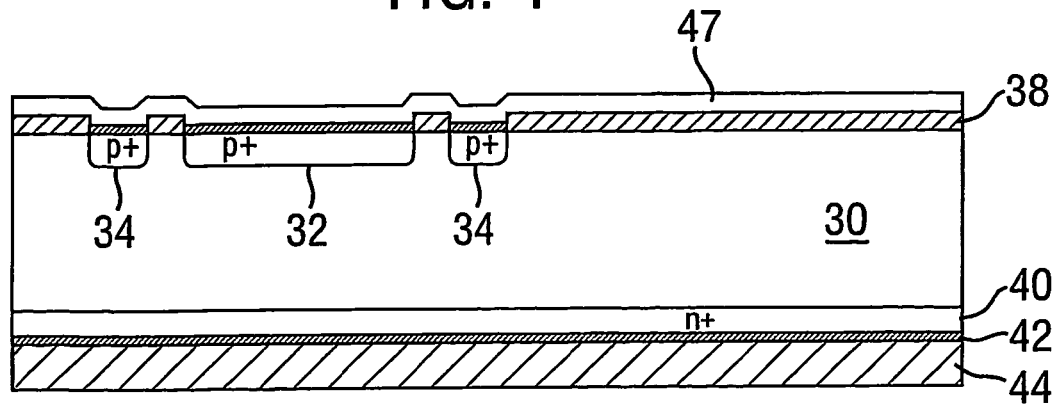

A photo-resist layer 47, or other alternative protective layer, is then deposited on the upper side of the substrate to protect the upper side of the substrate during subsequent processing steps, as shown in FIG. 4.

Figure 5:
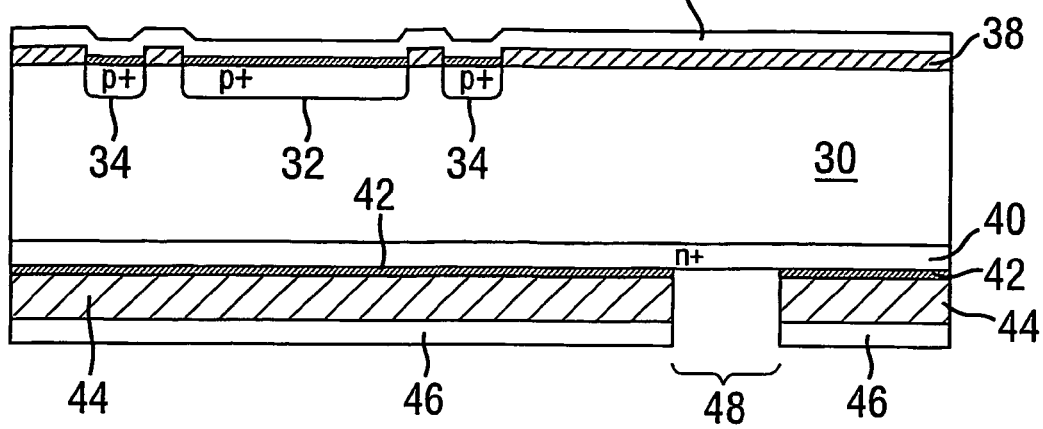

In a standard lithographic patterning step, a photo-resist layer 46 is deposited on the underside of the substrate, as shown in FIG. 5. The photoresist layer 46 is then patterned to form an opening 48, and used as a mask for chemical etching of the low temperature oxide layer 44 and the thin oxide layer 42 on the underside of the substrate. As shown in FIG. 5, a hole 48 is then opened through to the n+ layer 40 by etching.

Figure 6:
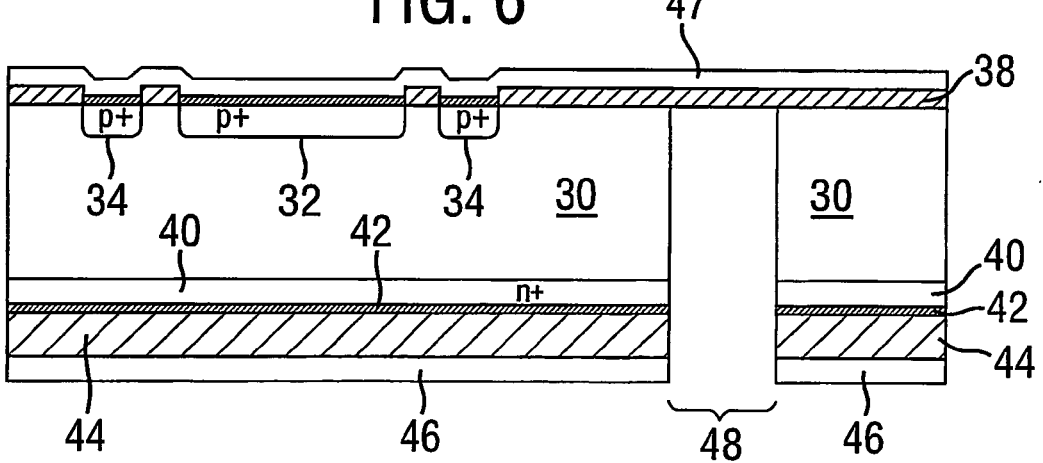
Figure 7:
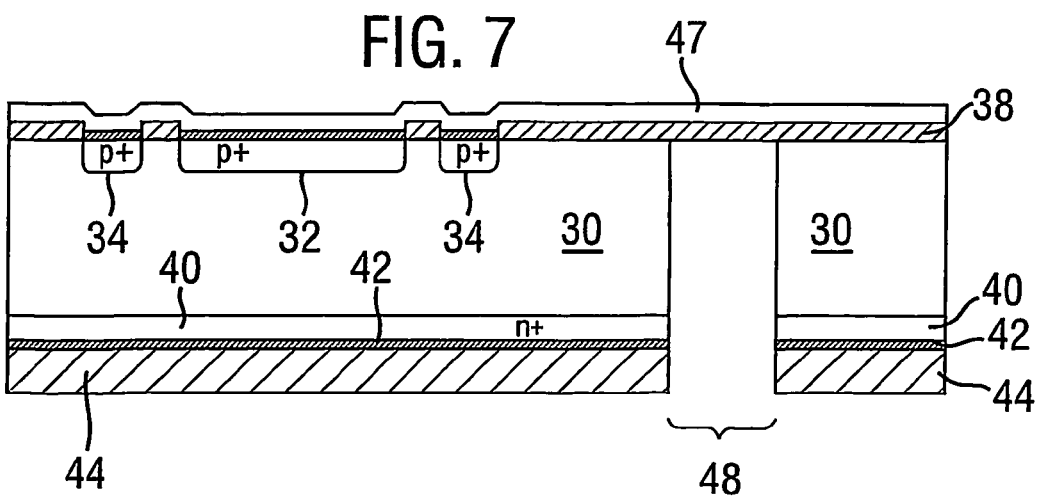

An inductively coupled plasma (ICP) reactor is then used for an etch of a high aspect ratio hole through the silicon wafer or the substrate all the way through to the field oxide layer 38 using the opening 48, as shown in FIG. 6. The substrate or wafer thickness is typically 350 to 750 μm and the diameter of the opening 48 is typically less than 200 μm. The photoresist layer 46 is then removed from the underside of the substrate, as illustrated in FIG. 7.

Figure 8:
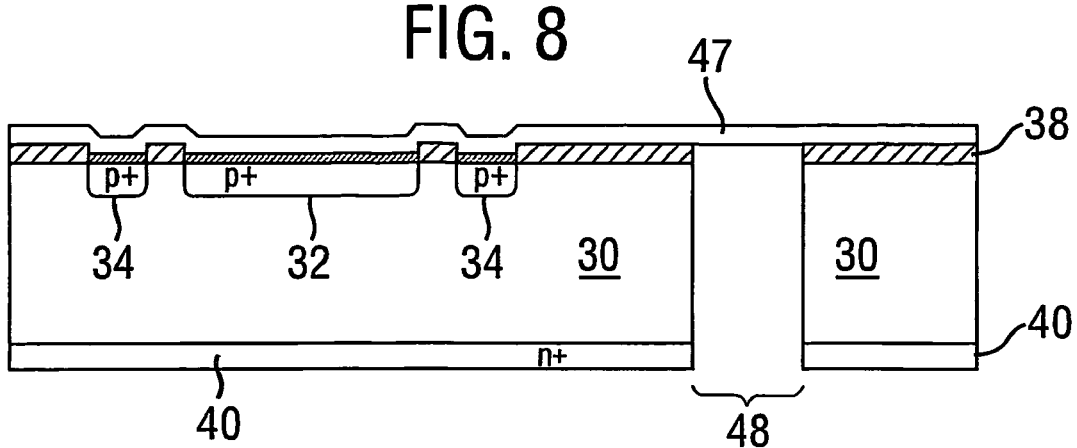

The remaining low temperature oxide layer 44 and thin oxide layer 42 are then removed from the underside of the substrate by etching, as well as the portion of the field oxide layer 38 exposed in the opening 48, as shown in FIG. 8.

Figure 9:
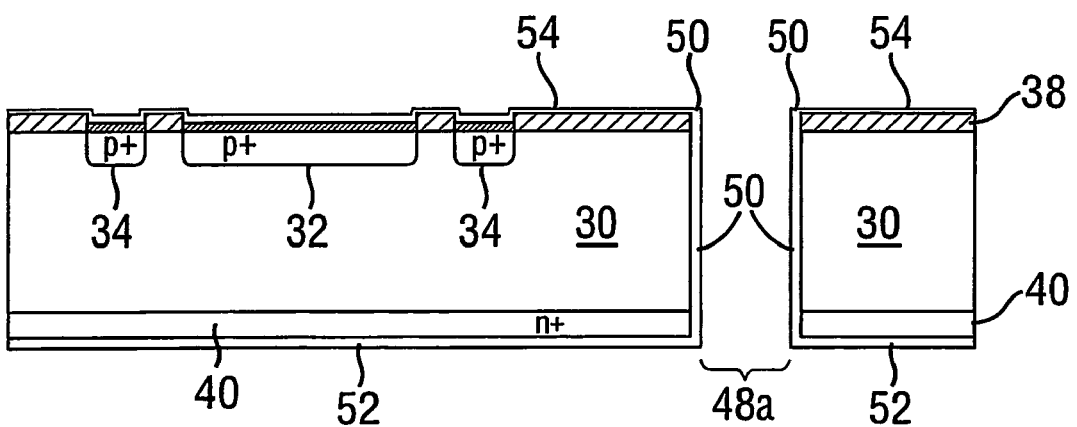

The photoresist layer 47 is then removed from the upper surface of the substrate, and a layer of silicon dioxide grown on the wafer, as shown in FIG. 9. The silicon oxide grows fastest on the inner walls of the opening 48, as represented by growth 50, and on the underside of the substrate, as represented by growth 52. A thin layer of silicon oxide 54 also grows on the upper surface of the substrate: a thin layer on the thin oxide on the surface, and a very thin layer on the field oxide layer. As such, the opening through the substrate is narrowed. This is indicated in FIG. 9 by reference numeral 48a, denoting a narrower opening.

Figure 10:
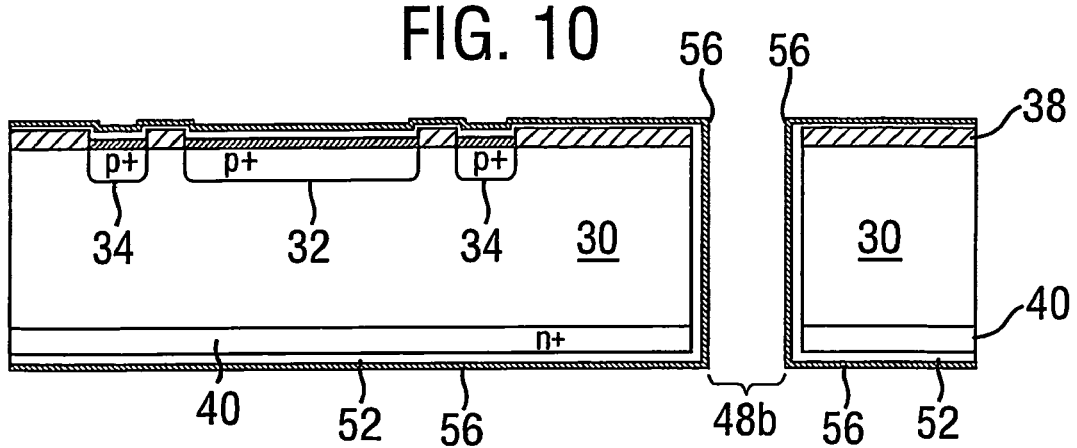

A layer of polysilicon 56 is then grown on the whole substrate, including the upper surface, the under-side surface, and the inner walls of the opening 48, as shown in FIG. 10. As an alternative to polysilicon, any sufficiently conductive material may be grown. As such, the opening through the substrate is further narrowed. This is indicated in FIG. 10 by reference numeral 48b, denoting a further narrower opening.

In order to pattern the polysilicon layer 56, the opening 48b is filled with a suitable removable material 58 as shown in FIG. 11. The removable material 58 may be a photoresist material or any other material which may be deposited in the whole volume of the opening 48b only, or may be patterned to remain only in the hole volume after removal of the material from the remainder of the substrate.

With the opening 48b suitably filled to protect the polysilicon formed in the opening and to prevent any chemicals from passing through the hole, the polysilicon 56 is patterned using standard lithographic techniques, to define areas of via contacts on both sides of the wafer, as shown in FIG. 12.

Contact openings are then etched on both sides of the substrate. On the upper side of the substrate, a contact opening 54 is etched through to the active area of the photodiode anode 32, and a contact opening 60 is etched to the anode guard ring 34. On the underside of the substrate, a contact opening 62 is etched for the bulk connection, i.e. the cathode. This is illustrated in FIG. 13.

Figure 14:
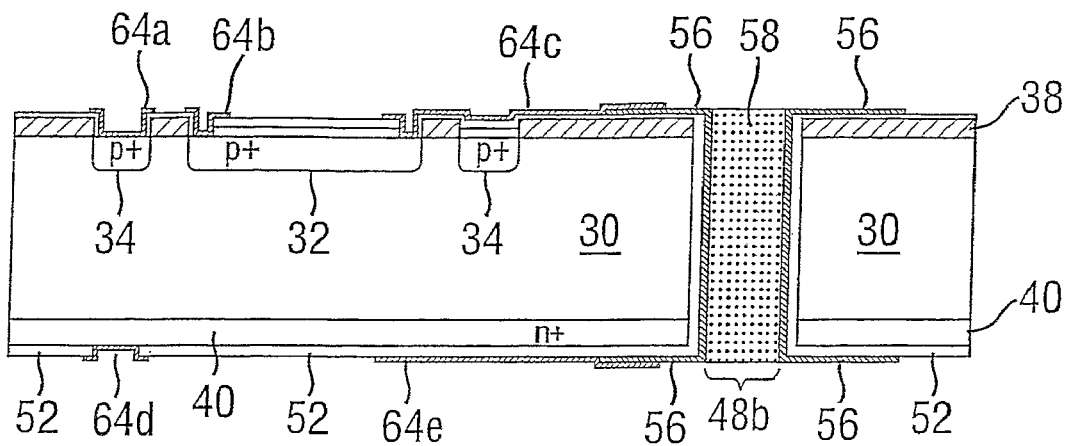

Aluminium layers 64 are then deposited on both sides of the substrate, and patterned using standard lithographic techniques. The resulting structure is shown in FIG. 14. An aluminium layer 64a is formed over at least part of the active region of the guard ring 34 in the opening 60. An aluminium layer 64b is formed over part of the active region 32 of the anode in the opening 59, and an aluminium layer 64c is further formed over a part of the active region 32 of the anode in the opening 54, and is connected to the polysilicon layer 56 on the top surface of the substrate. On the under surface of the substrate, an aluminium layer 64d connects to the cathode in the opening 62, and an aluminium layer 64e connects to the polysilicon layer 56.

Figure 15:
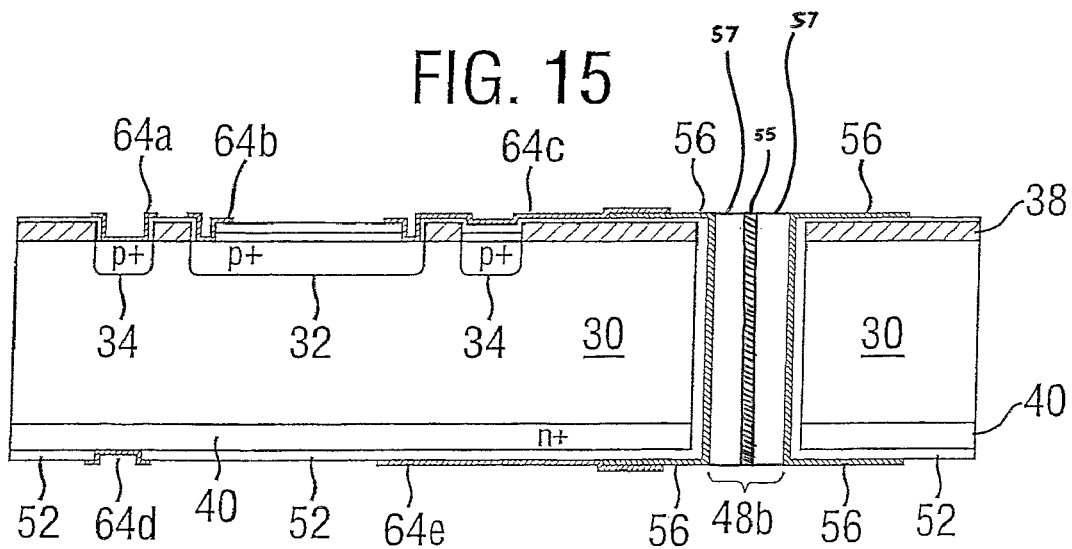

In an optional step, the material 58 used to fill the hole 48b is removed, as illustrated in FIG. 15. The polysilicon provided through the opening 48a provides a conductive via from one substrate surface to another, which conductive via is electrically isolated from the substrate. The hole 48b may be used, in further applications, to provide additional electrical connections through the substrate, by forming additional electrically isolated connections or vias. As illustrated in FIG. 15, an additional conductive element 55 is electrically isolated from the polysilicon layer 56 by insulating material 57.

The structure shown in FIGS. 14 and 15 thus has aluminium contact pads 64e and 64d for both the anode and the cathode on the underside of the substrate. The structure of only a single photo-diode is shown in FIGS. 2 to 15. For an array of photo-diodes, manufactured on a single silicon chip, a similar structure is provided throughout the whole device. Where an array of photo-diodes are provided on a single silicon chip, a single cathode contact may be common to several or all photodiodes.

For clarity, details of the guard ring contacting have not been presented in FIGS. 2 to 15. A contact pad for a guard ring structure could be provided on the underside of the substrate by manufacturing a via similar to the one manufactured for the anode of the photo-diode. More typically, guard rings of several or all photo-diodes on same photo-diode chip would have one common guard ring contact on the underside of the substrate provided by one or several vias on one photo-diode chip. One skilled in the art will fully appreciate the provision of such a contact on the underside of the substrate, for the guard ring, in accordance with the principles of the present invention as described above.

Thus all electrical connections for the photodiodes are provided, in accordance with the present invention, on the underside of the substrate, for connection off-chip. The electrical connections may be taken off-chip by wire-bonding or bump-bonding, for example, the underside of the substrate to electrical connectors or pads.

Figure 16:
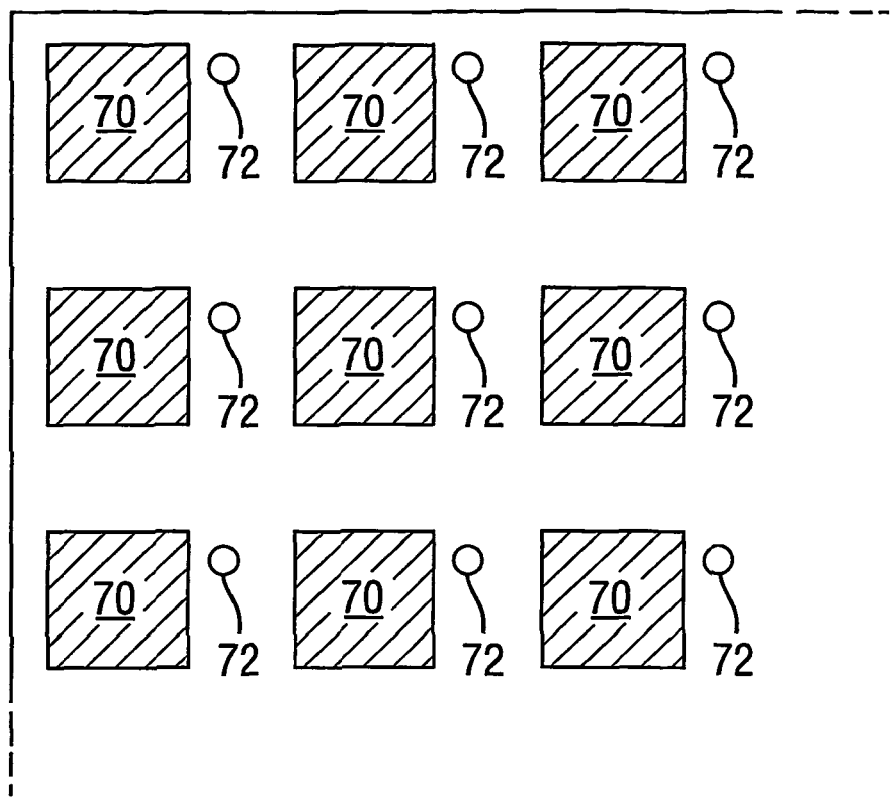
FIG. 16 illustrates a plan view of a photo-detector array manufactured in accordance with the process steps of FIGS. 2 to 15.

Referring to FIG. 16, there is illustrated schematically the structure of an array manufactured according to the present invention. As can be seen from FIG. 16, generally the substrate or wafer surface is provided with a plurality of active areas 70, corresponding to active areas of photodiodes.

Although the active areas are shown to be rectangular, the shape of the active areas is not relevant to the present invention. Each active area 70 is associated with an adjacent via 72, which is formed through the substrate. Although the vias are shown to have a circular cross-section, the shape of the cross-section of the vias is not relevant to the present invention. Similarly guard rings are not shown in FIG. 16. FIG. 16 is deliberately simplified to illustrate the described embodiment of the invention. Each of the active areas 70 is conductively connected to its associated conductive via by means not shown, but which will be apparent from FIGS. 14 and 15.

The present invention thus advantageously provides a technique for constructing a photo-detector array which does not require the provision of space at the edge of the array for the connection of the electrical output signals from the array. This advantage is obtained by connecting all signals from the semiconductor devices-through the substrate, such that they can be connected on the underside of the array rather than the side of the array.

Figure 17:
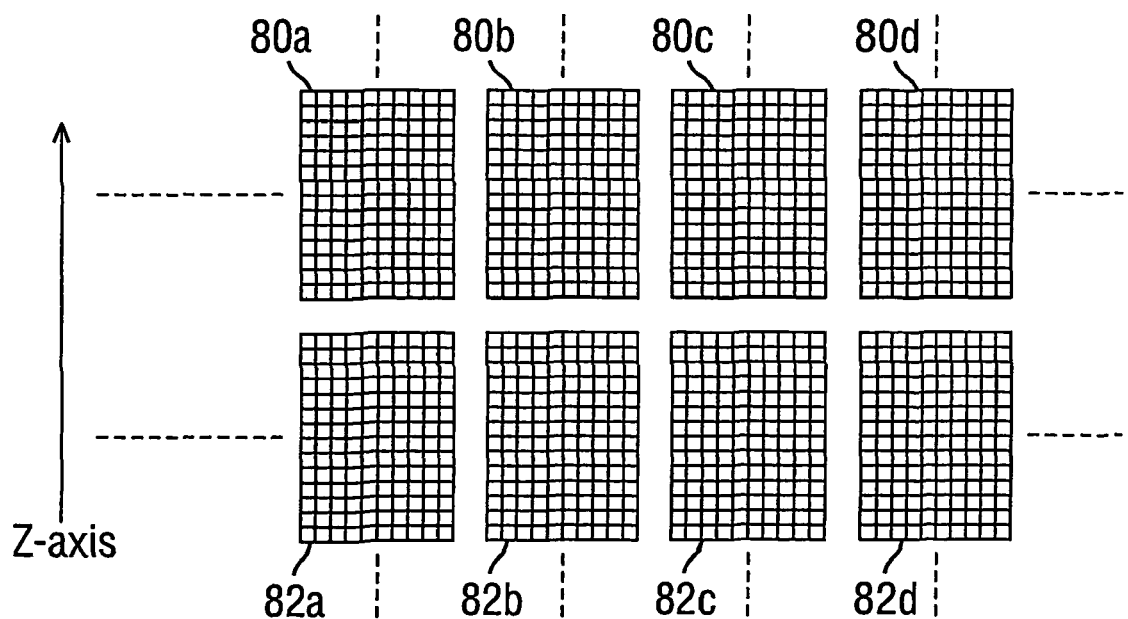
FIG. 17 illustrates the construction of a large photo-detector array in accordance with an advantageous implementation of the present invention.

As a result of the removal of the connections from the edge of the array, previously provided in the z direction, there is provided the possibility to extend the size of the overall photo-detector array in the z-axis. Referring to FIG. 17, a set of photo-detector arrays 80a to 80d in accordance with the known techniques for assembling arrays is placed together with a further set of arrays 82a to 82d, such that the overall array is extended in the z-axis. As will be appreciated, the array may be further extended in the z-axis. Although the arrays in FIG. 17 are shown slightly spaced apart, this is only to illustrate the fact that separate arrays are joined in two dimensions. In practice the arrays are in close proximity to each other in both directions, so as to combine to make a larger array. As such, a tiled structure of arrays can be built in two dimensions, to improve the performance of imaging systems.

Figure 18:
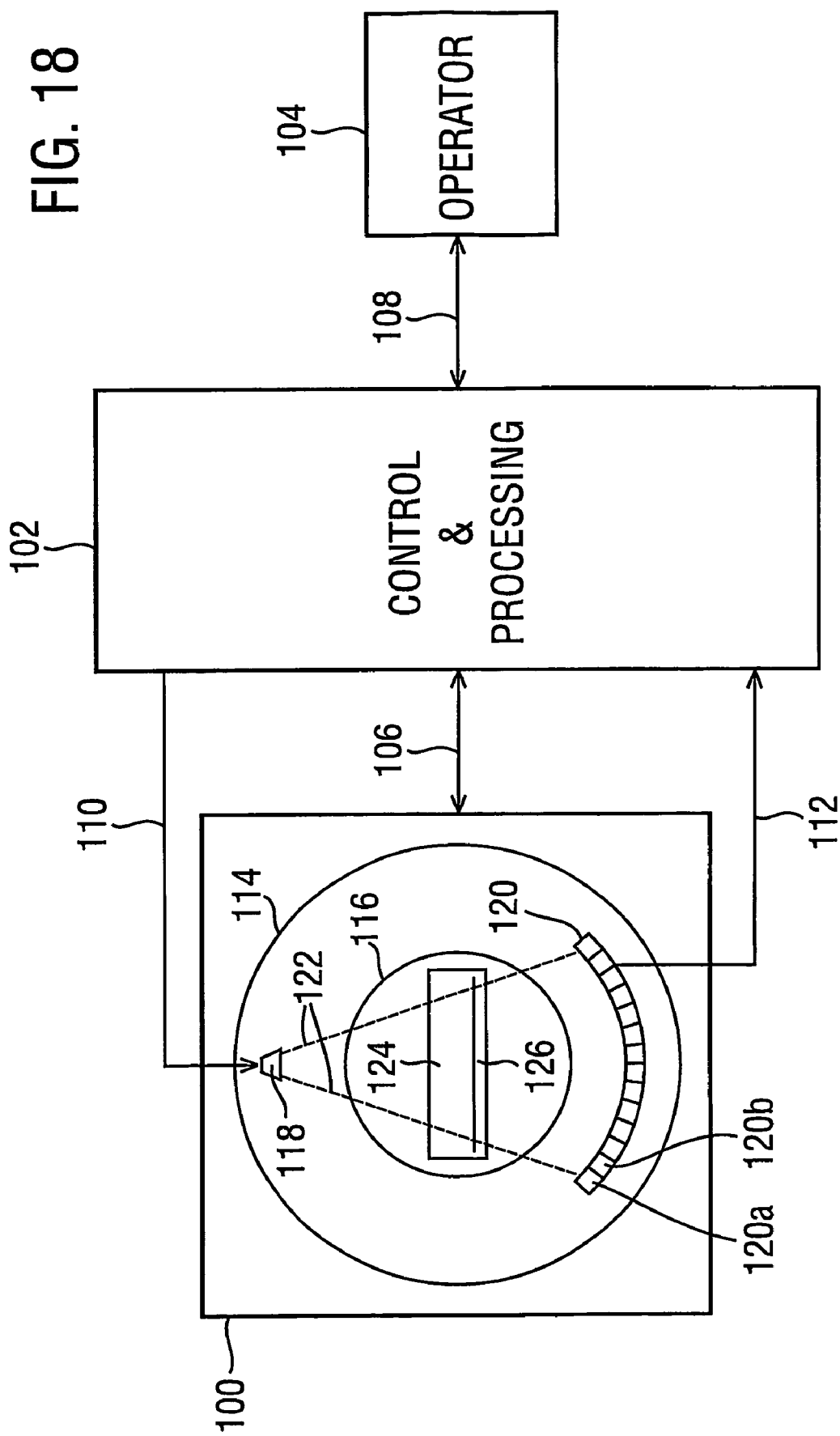
FIG. 18 illustrates a CT imaging system or machine within which the present invention may be advantageously incorporated in an embodiment.

The arrays 80a to 80d and 82a to 82d can be considered as sub-arrays, which together form a photo-detector array. The sub-arrays can be considered to form a matrix which forms a photo-detector array. The matrix effectively extends in two-dimensions, although in practice, as can be seen in FIG. 18 below, the matrix is curved such that the array extends in a third dimension.

Whilst the present invention has been described in relation to a particular processing technique for forming the advantageous structure of the present invention, it is not limited to such a technique. A chemical or mechanical method may be utilised to manufacture the hole through the substrate. Although inductively coupled plasma etching is foreseen as a practical solution to achieve this, other dry etching methods, drilling, spark erosion or laser drilling may also be used.

The invention enables the manufacture of fully 'tileable' detector structures with highly uniform detector properties.

The present invention has been described herein by way of reference to specific, non-limiting examples. For example, the invention is more generally applicable than the described application to photo-detectors in imaging systems. In addition, the invention is not limited to any particular material given herein by way of example. The invention is more generally applicable to substrates, wafers and semiconductor devices and the manufacture thereof. The invention, however, is clearly advantageously applicable in implementations requiring arrays of semiconductor devices that must be connected off the device.

Referring to FIG. 18, there is illustrated the main elements of a CT imaging machine within which a photo-detector array may be constructed in accordance with a preferred embodiment of the invention, and advantageously utilised. The construction of such machines is well-known in the art, and will be familiar to one skilled in the art. Only the main elements of such a machine are shown in FIG. 18, to illustrate the use of the present invention.

The machine principally comprises a scanner generally designated by reference numeral 100, a control and processing means generally designated by reference numeral 102, and an operator interface generally designated by reference numeral 104.

The scanner 100 generally comprises a cylindrical structure 114, a cross-section through which is illustrated in FIG. 18, Within the cylindrical structure 114 there is mounted an x-ray source 118 and an array of photo-detectors 120. The array of photo-detectors 120 comprises a plurality of arrays such as the arrays 80 of FIG. 17. Thus the array 120 is made up of a plurality of arrays 120a, 120b etc. In the arrangement of FIG. 18, the photo-detector arrays 120a, 120b etc are implemented in a tiled structure in accordance with the present invention, and the arrays are connected not only in the plane shown in the cross-section of FIG. 18, but also in the z-direction, i.e. into the page along the length of the cylindrical structure 114.

The X-ray source 118 emits X-rays under the control of a signal on line 110 from the control and processing means 102. The X-rays, having a radiation pattern in cross-section generally designated by dashed lines 122, have a footprint which falls onto the photo-detector array 120, which in accordance with the techniques of the present invention extends in the direction of the cylindrical axis, as well as in the direction shown in the cross-section of FIG. 18. The outputs from the photo-detectors are provided to the control and processing means 102 on a signal line 112.

An object to be imaged, such as a patient 124, is placed on a table 126 which is typically moved through the imaging machine in the z-direction. In utilising a photo-detector array in accordance with the present invention, any movement of the table may be reduced or rendered unnecessary.

The control and processing means 102 includes all necessary means for controlling the mechanical and electronic operation of the scanner 100, including the means for controlling the X-ray source 118 and for processing signals received from the photo-detector array 120. Additional transfer of signals between the control and processing means and the scanner 100 are represented by signal connections 106.

The operator interface 104 communicates with the control and processing means, as represented by signals 108. The operator interface 104 preferably is used to control the operation of the scanner 100, and display results of the scanning process.

FIG. 18 represents one useful application of a photo-detector array constructed in accordance with the principles of a preferred embodiment of the present invention. Other useful and advantageous applications will be apparent to one skilled in the art.

It should be understood that the invention is more generally applicable than the examples given herein. One skilled in the art will understand the broader applicability of the present invention. The scope of the invention is defined by the appended claims.

The invention claimed is:

1. A semiconductor substrate including a plurality of photodetectors, each photodetector of the plurality having an active area on a first surface of the substrate and a further active area on the side of a second surface of the substrate, wherein each photodetector of the plurality is provided with an adjacent conductive via electrically isolated from the substrate, from the first surface of the substrate to the second surface of the substrate, for connecting the active area to the second surface of the substrate, wherein the conductive vias comprise respective polysilicon conductive elements formed on the inner walls of the vias, the second surface providing electrical connections for the active areas and the further active areas of the plurality of photodetectors, and wherein there is provided a further conductive element from the side of the first surface of the substrate to the side of the second surface within at least one of the conductive vias, said further conductive element being electrically isolated from the polysilicon conductive element of the conductive via within which said further conductive element is contained.

2. A substrate according to claim 1, wherein there is provided a further conductive element connected between the active area of at least one of the photo-detectors and the respective conductive via.

3. A substrate according to claim 1, wherein there is provided a further conductive element on the side of the second surface of the substrate connected to at least one of the conductive vias.

4. A substrate according to claim 3, wherein the further conductive element on the side of the second surface of the substrate is for making an off-chip connection to the conductive via.

5. A substrate according to claim 1, wherein the photodetectors are photodiodes.

6. A substrate according to claim 5, wherein the active areas on the first surface of the substrate are anodes.

7. A substrate according to claim 5, wherein the further active areas are cathodes.

8. A substrate according to claim 1, wherein the further active areas are formed as a layer on the second surface.

9. A substrate according to claim 1, wherein the photodetectors are photodiodes of at least one of the following: an imaging system, a medical imaging system, and a computed tomography system.

10. A substrate according to claim 1, wherein the plurality of photodetectors forms an array of photodetectors.

11. A substrate according to claim 10, wherein the array of photodetectors extends in two directions.

12. A substrate according to claim 10, wherein the array of photodetectors is arranged into a plurality of sub-arrays of photodetectors.

13. A semiconductor substrate including a plurality of photodetectors, each photodetector of the plurality having an active area on a first surface of the substrate and a further active area on the side of a second surface of the substrate, wherein each photodetector of the plurality is provided with an adjacent conductive via electrically isolated from the substrate, said via extending from the first surface of the substrate to the second surface of the substrate and connecting the active area to the second surface of the substrate, wherein the conductive vias comprise respective polysilicon conductive elements formed on the inner walls of the vias, and wherein there is provided a further conductive element comprising an additional electrically isolated via from the side of the first surface of the substrate to the side of the second surface within at least one of the conductive vias, said further conductive element being electrically isolated from the polysilicon conductive element of the conductive via within which said further conductive element is contained, and further wherein there is provided a guard ring structure for each photodetector formed at the first surface of the substrate, the additionally electrically isolated via connecting the guard ring to the second surface of the substrate, the second surface providing electrical connections for the active areas, the further active areas, and the guard rings of the plurality of photodetectors.

14. The substrate of claim 1, wherein the at least one of the conductive vias provides a plurality of electrical connections from the active area to the further active area.

15. The substrate of claim 14, wherein the plurality of electrical connections from the active area to the further active area comprises a first electrical connection through the polysilicon conductive element and a second electrical connection through the further conductive element.

* * * * *